(12) United States Patent
Kim

(10) Patent No.: US 10,923,192 B2
(45) Date of Patent: Feb. 16, 2021

(54) MEMORY SYSTEM AND OPERATING METHOD THEREOF

(71) Applicant: SK hynix Inc., Gyeonggi-do (KR)

(72) Inventor: Kyung-Bum Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 103 days.

(21) Appl. No.: 16/206,128

(22) Filed: Nov. 30, 2018

(65) Prior Publication Data

US 2019/0348124 A1 Nov. 14, 2019

(30) Foreign Application Priority Data

May 9, 2018 (KR) ........................ 10-2018-0052919

(51) Int. Cl.
| | |
|---|---|
| *G06F 11/00* | (2006.01) |
| *G11C 16/10* | (2006.01) |
| *G06F 11/10* | (2006.01) |
| *G11C 16/34* | (2006.01) |
| *G11C 16/04* | (2006.01) |
| *G11C 29/52* | (2006.01) |

(52) U.S. Cl.
CPC .......... *G11C 16/10* (2013.01); *G06F 11/1068* (2013.01); *G11C 16/0483* (2013.01); *G11C 16/3459* (2013.01); *G11C 29/52* (2013.01)

(58) Field of Classification Search
CPC ..... G11C 16/10; G11C 29/52; G11C 16/0483; G06F 11/1068
See application file for complete search history.

(56) References Cited

U.S. PATENT DOCUMENTS

| | | | | |
|---|---|---|---|---|
| 8,365,030 | B1* | 1/2013 | Choi | G06F 11/1048 |
| | | | | 714/746 |
| 8,934,301 | B2* | 1/2015 | Yun | G11C 16/06 |
| | | | | 365/185.09 |
| 9,093,171 | B2* | 7/2015 | Kim | G11C 11/5642 |
| 10,121,551 | B1* | 11/2018 | Miller | G06F 1/305 |
| 10,140,059 | B2* | 11/2018 | Tokiwa | G06F 3/0679 |
| 10,242,734 | B1* | 3/2019 | Khakifirooz | G11C 16/3418 |
| 10,261,721 | B2* | 4/2019 | Liu | G06F 11/1068 |
| 2008/0244338 | A1* | 10/2008 | Mokhlesi | G06F 11/1068 |
| | | | | 714/702 |
| 2009/0210776 | A1* | 8/2009 | Cho | G06F 11/1072 |
| | | | | 714/805 |
| 2009/0319843 | A1* | 12/2009 | Meir | G06F 11/1068 |
| | | | | 714/746 |
| 2015/0332772 | A1* | 11/2015 | Kim | G11C 16/30 |
| | | | | 365/185.22 |

FOREIGN PATENT DOCUMENTS

| | | |
|---|---|---|
| KR | 1020160140506 | 12/2016 |
| KR | 1020170062351 | 6/2017 |

* cited by examiner

*Primary Examiner* — Esaw T Abraham
(74) *Attorney, Agent, or Firm* — IP & T Group LLP

(57) ABSTRACT

A memory system may include: a memory device including a plurality of memory blocks each having a plurality of pages; and a controller suitable for controlling the memory device to perform program operations in the pages, the memory device may check program voltage distributions of the programmed pages, and may check fail bits in the programmed pages, and the controller may confirm a partial program success in the program operations, and may perform a copy operation for first data corresponding to the partial program success, in the memory blocks.

21 Claims, 13 Drawing Sheets

MEMORY SYSTEM AND OPERATING METHOD THEREOF

CROSS-REFERENCE TO RELATED APPLICATION

This application claims priority under 35 U.S.C. § 119 to Korean Patent Application No. 10-2018-0052919 filed on May 9, 2018, the entire disclosure of which is incorporated herein by reference in its entirety.

BACKGROUND

1. Field

Various exemplary embodiments of the present invention generally relate to a memory system. Particularly, the embodiments relate to a memory system which processes data with respect to a memory device, and an operating method thereof.

2. Discussion of the Related Art

The computer environment paradigm has been shifting to ubiquitous computing, which enables computer systems to be used anytime and anywhere. As a result, use of portable electronic devices such as mobile phones, digital cameras, and notebook/laptop computers has rapidly increased. These portable electronic devices generally use a memory system having one or more memory devices for storing data. A memory system may be used as a main or an auxiliary storage device of a portable electronic device.

Such memory systems provide excellent stability, durability, high information access speed, and low power consumption because they have no moving parts. Examples of memory systems having such advantages include universal serial bus (USB) memory devices, memory cards having various interfaces, and solid state drives (SSD).

SUMMARY

Various embodiments are directed to a memory system and an operating method thereof, capable of minimizing complexity and performance deterioration of a memory system and maximizing use efficiency of a memory device, thereby quickly and stably processing data with respect to the memory device.

In an embodiment, a memory system may include: a memory device including a plurality of memory blocks each having a plurality of pages; and a controller suitable for controlling the memory device to perform program operations in the pages, the memory device may check program voltage distributions of the programmed pages, and may check fail bits in the programmed pages, and the controller may confirm a partial program success in the program operations, and may perform a copy operation for first data corresponding to the partial program success, in the memory blocks.

The memory device may check the fail bits for the respective program voltage distributions, may count fail bit numbers of the fail bits for the respective program voltage distributions, and may confirm the partial program success according to the fail bit numbers.

The memory device may sum the fail bit numbers for the respective program voltage distributions for respective program voltage distribution groups, and may confirm a program voltage distribution group of which summed fail bit number is smaller than a threshold, as a partially successful program voltage distribution group corresponding to the partial program success.

The memory device may sum the fail bit numbers for the respective program voltage distributions for the respective program voltage distribution groups by summing a first summed fail bit number of a first program voltage distribution group, a second summed fail bit number of a second program voltage distribution group, and a third summed fail bit number of a third program voltage distribution.

The first program voltage distribution group may include program voltage distributions corresponding to least significant bit (LSB) pages in the memory blocks, the second program voltage distribution group may include program voltage distributions corresponding to central significant bit (CSB) pages in the memory blocks, and the third program voltage distribution group may include program voltage distributions corresponding to most significant bit (MSB) pages in the memory blocks.

The threshold may represent a maximum error-correction capability of the controller.

The controller may receive a status signal indicating the partial program success from the memory device, may confirm the partial program success in the program operations in correspondence to the status signal, may identify first pages of a first memory block corresponding to the partially successful program voltage distribution group, and reads and error-corrects the first data stored in the first pages.

The controller may control the memory device to store the error-corrected first data in at least ones of second pages of the first memory block and first pages of a second memory block.

The first data may be one of entire data stored in the first pages and data stored in pages in which fail bits are included, among the first pages.

The memory device may check a highest level program voltage distribution among the program voltage distributions, and, when the highest level program voltage distribution is a pass, may check the fail bits in the remaining program voltage distributions.

The memory system may further include: a check component suitable for checking the program voltage distributions in the memory blocks through a current sensing circuit (CSC), and outputting the status signal indicating the partial program success to the controller, and may include: an operation check component including the current sensing circuit, and suitable for checking the program voltage distributions; a counter suitable for counting the fail bits in the program voltage distributions; a sum component suitable for summing the fail bit numbers of counted fail bits; a comparator suitable for comparing the summed fail bit number of the fail bit numbers and the threshold; and a storage suitable for storing the fail bit numbers, the summed fail bit number and the threshold.

In an embodiment, a method for operating a memory system, may include: performing program operations for a memory device including a plurality of memory blocks each having a plurality of pages; checking program voltage distributions of the programmed pages; checking fail bits in the programmed pages; confirming a partial program success in correspondence to the fail bits in the program operations; and performing a copy operation for first data corresponding to the partial program success, in the memory blocks.

The checking of the fail bits may include: checking the fail bits for the respective program voltage distributions; counting fail bit numbers of the fail bits for the respective program voltage distributions; and summing the fail bit numbers for the respective program voltage distributions for respective program voltage distribution groups.

The confirming of the partial program success may include: confirming the partial program success according to the fail bit numbers; and confirming a program voltage distribution group of which summed fail bit number is smaller than a threshold, as a partially successful program voltage distribution group corresponding to the partial program success.

The threshold may represent a maximum error-correction capability of a controller of the memory device.

The performing of the copy operation may include: identifying first pages of a first memory block corresponding to the partially successful program voltage distribution group in correspondence to a status signal indicating the partial program success; reading and error-correcting the first data stored in the first pages; and storing the error-corrected first data in at least ones of second pages of the first memory block and first pages of a second memory block.

The first data may be one of entire data stored in the first pages and data stored in pages in which fail bits are included, among the first pages.

The summing of the fail bit numbers for the respective program is voltage distributions for the respective program voltage distribution groups may include: summing a first summed fail bit number of a first program voltage distribution group, a second summed fail bit number of a second program voltage distribution group, and a third summed fail bit number of a third program voltage distribution.

The first program voltage distribution group may include program voltage distributions corresponding to least significant bit (LSB) pages in the memory blocks, the second program voltage distribution group may include program voltage distributions corresponding to central significant bit (CSB) pages in the memory blocks, and the third program voltage distribution group may include program voltage distributions corresponding to most significant bit (MSB) pages in the memory blocks.

The checking of the fail bits may include: checking a highest level program voltage distribution among the program voltage distributions; and checking, when the highest level program voltage distribution is a pass, the fail bits in the remaining program voltage distributions.

In an embodiment, a memory system may include: a memory device including: first and second logical pages; and a peripheral circuit suitable for: performing program and verify operations on the first logical page; performing, when the verify operation fails, a count operation of counting a number of failed bits of the first logical page; and performing, when the number of failed bits is smaller than an error-correction capability of a controller, a program operation of programming data of the first logical page, which is error-corrected, into the second logical page; and the controller suitable for: controlling the program, verify, count and copy operations; determining whether the verify operation fails and whether the number of failed bits is smaller than the error-correction capability;

and error-correcting the data of the first logical page.

BRIEF DESCRIPTION OF THE DRAWINGS

These and other features and advantages of the present invention will become apparent to those skilled in the art to which the present invention pertains from the following detailed description in reference to the accompanying drawings, wherein.

DETAILED DESCRIPTION

Figure 1:
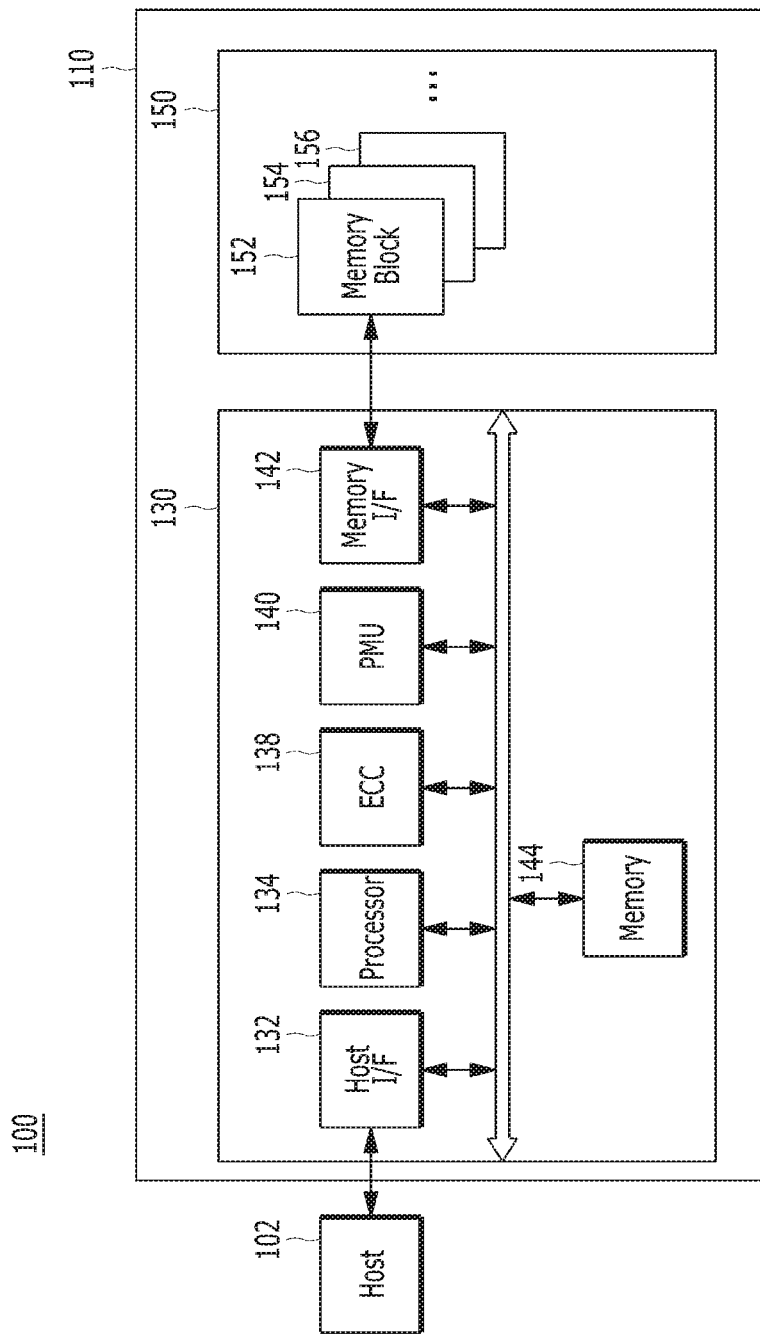
FIG. 1 is a block diagram illustrating a data processing system including a memory system in accordance with an embodiment of the present invention.

Various embodiments of the present invention are described below in more detail with reference to the accompanying drawings. We note, however, that the present invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention. It is noted that reference to "an embodiment" does not necessarily mean only one embodiment, and different references to "an embodiment" are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well and vice versa, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 including a memory system 110 in accordance with an embodiment of the present invention.

Referring to FIG. 1, the data processing system 100 may include a host 102 and the memory system 110.

The host 102 may include portable electronic devices such as a mobile phone, MP3 player and laptop computer or non-portable electronic devices such as a desktop computer, game machine, TV and projector.

The memory system 110 may operate to store data for the host 102 in response to a request of the host 102. Non-limiting examples of the memory system 110 may include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC. The SD card may include a mini-SD card and micro-SD card.

The memory system 110 may be embodied by various types of storage devices. Non-limiting examples of storage devices included in the memory system 110 may include volatile memory devices such as a DRAM dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM) and a flash memory. The flash memory may have a 3-dimensional (3D) stack structure.

The memory system 110 may include a memory device 150 and a controller 130. The memory device 150 may store data for the host 120, and the controller 130 may control data storage into the memory device 150.

The controller 130 and the memory device 150 may be integrated into a single semiconductor device, which may be included in the various types of memory systems as exemplified above.

Non-limiting application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory dies (not shown), each memory die including a plurality of planes (not shown), each plane including a plurality of memory blocks 152 to 156, each of the memory blocks 152 to 156 may include a plurality of pages, and each of the pages may include a plurality of memory cells coupled to a word line.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

The controller 130 may include a host interface (I/F) 132, a processor 134, an error correction code (ECC) component 138, a Power Management Unit (PMU) 140, a memory interface 142 such as a NAND flash controller (NFC), and a memory 144 all operatively coupled via an internal bus.

The host interface 132 may be configured to process a command and data of the host 102, and may communicate with the host 102 through one or more of various interface protocols such as universal serial bus (USB), multi-media card (MMC), peripheral component interconnect-express (PCI-e or PCIe), small computer system interface (SCSI), serial-attached SCSI (SAS), serial advanced technology attachment (SATA), parallel advanced technology attachment (DATA), enhanced small disk interface (ESDI) and integrated drive electronics (IDE).

The ECC component 138 may detect and correct an error contained in the data read from the memory device 150. In other words, the ECC component 138 may perform an error correction decoding process to the data read from the memory device 150 through an ECC code used during an ECC encoding process. According to a result of the error correction decoding process, the ECC component 138 may output a signal, for example, an error correction success/fail signal. When the number of error bits is more than a is threshold value of correctable error bits, the ECC component 138 may not correct the error bits, and may output an error correction fail signal.

The ECC component 138 may perform error correction through a coded modulation such as Low Density Parity Check (LDDC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC component 138 is not limited thereto. The ECC component 138 may include all circuits, modules, systems or devices for error correction.

The PMU 140 may provide and manage power of the controller 130.

The memory interface 142 may serve as a memory/storage interface for interfacing the controller 130 and the memory device 150 such that the controller 130 controls the memory device 150 in response to a request from the host 102. When the memory device 150 is a flash memory or specifically a NAND flash memory, the memory interface 142 may generate a control signal for the memory device 150 and process data to be provided to the memory device 150 under the control of the processor 134. The memory interface 142 may work as an interface (e.g., a NAND flash interface) for processing a command and data between the controller 130 and the memory device 150. Specifically, the memory interface 142 may support data transfer between the controller 130 and the memory device 150.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM).

The memory 144 may be disposed within or out of the controller 130. FIG. 1 exemplifies the memory 144 disposed within the controller 130. In an embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL).

Also, in the memory system 110 in accordance with the embodiment of the disclosure, in the case where a plurality of command operations corresponding to a plurality of commands received from the host 102 are performed in the memory device 150, whether the command operations performed in the memory device 150 have succeeded or failed may be determined. In the memory system 110 in accordance with the embodiment of the present disclosure, in the case where program operations corresponding to a plurality of write commands received from the host 102 are performed in the memory blocks of the memory device 150, by checking, through a current sensing circuit (CSC, not shown), program voltage distributions in correspondence to the performance of the program operations in the memory blocks of the memory device 150, whether the program voltage distributions passes or fails ("fail" or "fails" can also be referred to as "failure" or "failures" throughout the disclosure) are checked, and, accordingly, whether the program operations performed in the memory blocks of the memory device 150 have succeeded or failed may be determined. In particular, in the memory system in accordance with the embodiment of the present disclosure, as program operations are performed, a pass or a failure is checked for each of program voltage distributions respectively indicating program states in the memory blocks, and whether the program operations have succeeded or failed may be determined through the passes or failures of the program voltage distributions, thereby is reducing the number of additional program operations. Since detailed descriptions will be made later with reference to FIGS. 5 to 10 for describing an operation of performing program operations in memory blocks included in a memory device 150 and an operation of checking whether the program operations have succeeded or failed, further descriptions thereof will be omitted herein.

The processor 134 of the controller 130 may include a management unit (not illustrated) for performing a bad management operation of the memory device 150. The management unit may perform a bad block management operation of checking a bad block, in which a program fail occurs due to the characteristic of a NAND flash memory during a program operation, among the plurality of memory blocks 152 to 156 included in the memory device 150. The management unit may write the program-failed data of the bad block to a new memory block. In the memory device 150 having a 3D stack structure, the bad block management operation may reduce the use efficiency of the memory device 150 and the reliability of the memory system 110. Thus, the bad block management operation needs to be performed with more reliability.

Figure 2:
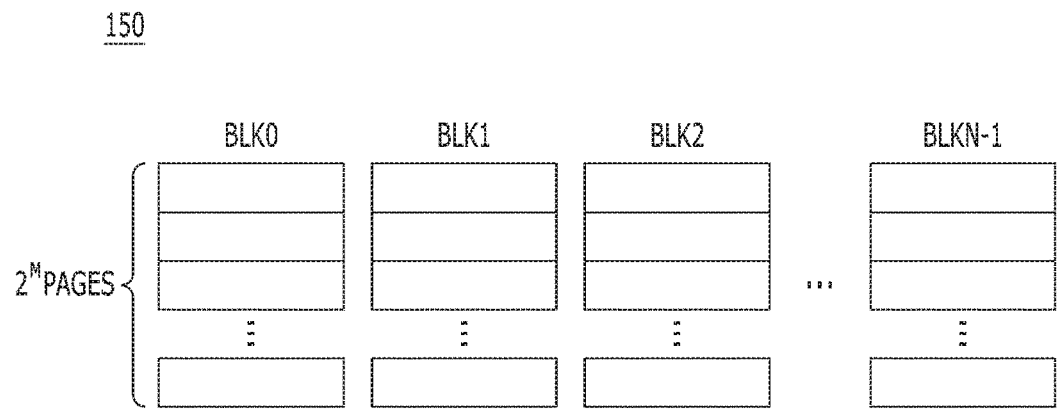
FIG. 2 is a schematic diagram illustrating an exemplary configuration of a memory device employed in the memory system shown in FIG. 1.

FIG. 2 is a schematic diagram illustrating the memory device 150 of FIG. 1.

Referring to FIG. 2, the memory device 150 may include a plurality of memory blocks 0 to N-1, for example, memory block 0 BLOCK0 (210), memory block 1 BLOCK1 (220), memory block 2 BLOCK2 (230) to memory block N-1 BLOCKN-1 (240), and each of the blocks 0 to N-1 may include a plurality of pages, for example, $2^M$ pages, the number of which may vary according to circuit design. Memory cells included in the respective memory blocks 0 to N-1 may be one or more of a single level cell (SLC) storing 1-bit data, or a multi-level cell (MLC) storing 2 or more bits of data. In an embodiment, the memory device 150 may include a plurality of triple level cells (TLC) each storing 3-bit data. In another embodiment, the memory device may include a plurality of quadruple level cells (QLC) each storing 4-bit level cell.

Figure 3:
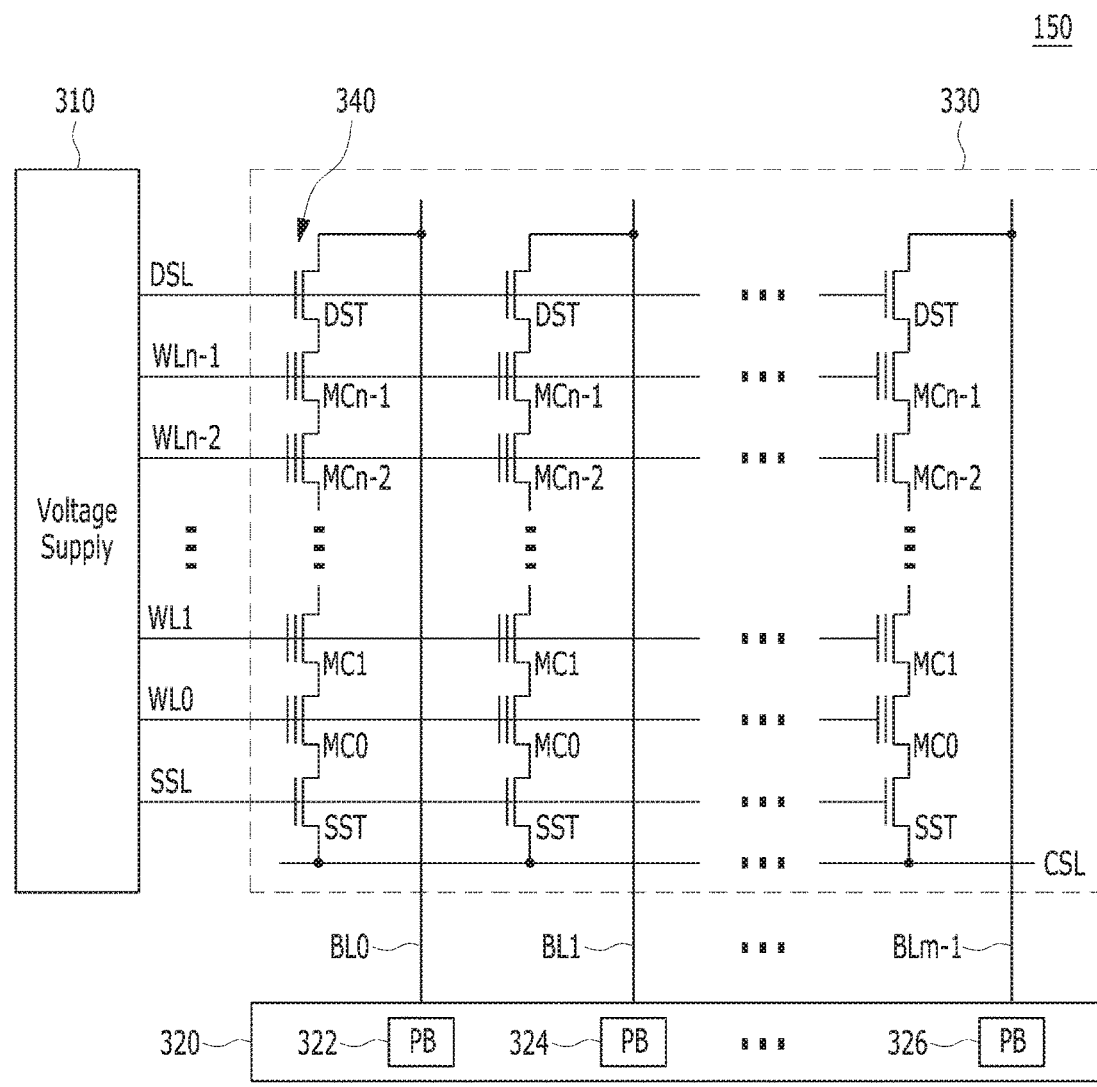
FIG. 3 is a circuit diagram illustrating an exemplary configuration of a memory cell array of a memory block in the memory device shown in FIG. 2.

FIG. 3 is a circuit diagram illustrating an exemplary configuration of a memory cell array of a memory block in the memory device 150.

Referring to FIG. 3, a memory block 330 of the memory device 150 may correspond to any of the plurality of memory blocks 152 to 156 included in the memory device 150 of the memory system 110 may include a plurality of cell strings 340 coupled to a plurality of corresponding bit lines BL0 to BLm-1. The cell string 340 of each column may include one or more drain select transistors DST and one or more source select transistors SST. Between the drain and source select transistors DST and SST, a plurality of memory cells MC0 to MCn-1 may be coupled in series. In an embodiment, each of the memory cell transistors MC0 to MCn-1 may be embodied by an MLC capable of storing data information of a plurality of bits. Each of the cell strings 340 may be electrically coupled to a corresponding bit line among the plurality of bit lines BL0 to BLm-1. For example, as illustrated in FIG. 3, the first cell string is coupled to the first bit line BL0, and the last cell string is coupled to the last bit line BLm-1.

Although FIG. 3 illustrates NAND flash memory cells, the invention is not limited in this way. It is noted that the memory cells may be NOR flash memory cells, or hybrid flash memory cells including two or more kinds of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply 310 which provides word line voltages including a program voltage, a read voltage and a pass voltage to supply to the word lines according to an operation mode. The voltage generation operation of the voltage supply 310 may be controlled by a control circuit (not illustrated). Under the control of the control circuit, the voltage supply 310 may select one of the memory blocks (or sectors) of the memory cell array, select one of the word lines of the selected memory block, and provide the word line voltages to the selected word line and the unselected word lines as may be needed.

The memory device 150 may include a read/write circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
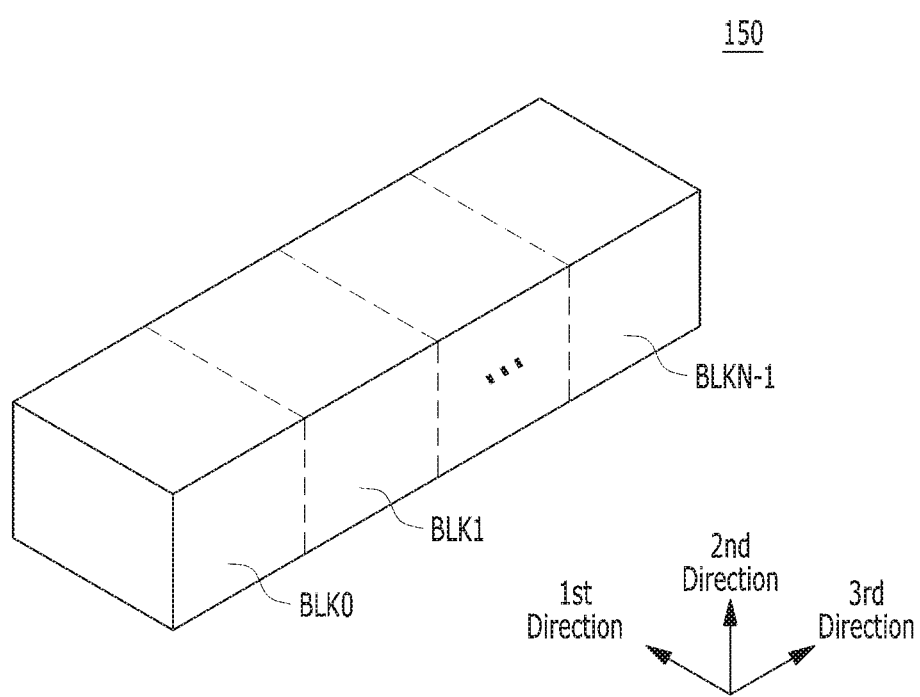
FIG. 4 is a schematic diagram illustrating an exemplary three-dimensional structure of the memory device shown in FIG. 2.

FIG. 4 is a schematic diagram illustrating an exemplary three-dimensional (3D) structure of the memory device 150.

The memory device 150 may be embodied by a 2D or 3D memory device. Specifically, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN-1 each having a 3D structure (or vertical structure).

Hereinbelow, detailed descriptions will be made with reference to FIGS. 5 to 10, for a data processing operation with respect to the memory device 150 in the memory system in accordance with the embodiment of the present disclosure, particularly, a data processing operation in the case of performing a command operation for the memory device 150.

FIGS. 5 to 9 are schematic diagrams to assist in the explanation of a data processing operation in a memory system in accordance with an embodiment. In the embodiment of the present disclosure, for the sake of convenience in explanation, detailed descriptions will be made by taking as an example a case where, in the memory system 110 shown in FIG. 1, a plurality of commands are received from the host 102 and command operations corresponding to the commands are performed. For example, in the embodiment of the present disclosure, detailed descriptions will be made for a data processing operation in the case of receiving a plurality of write commands from the host 102 and performing program operations corresponding to the write commands.

Moreover, in the embodiment of the present disclosure, descriptions will be made by taking as an example a case where, after storing write data corresponding to a plurality of write commands received from the host 102, in the buffer/cache included in the memory 144 of the controller 130, the write data stored in the buffer/cache are programmed to and stored in the plurality of memory blocks included in the memory device 150, and, after updating map data in correspondence to the storing of the write data in the plurality of memory blocks, the updated map data are stored in the plurality of memory blocks included in the memory device 150. That is, in the embodiment of the present disclosure, descriptions will be made by taking as an example a case where program operations corresponding to a plurality of write commands received from the host 102 are performed. While, in the embodiment of the present disclosure, it will be described below as an example for the sake of convenience in explanation that the controller 130 performs command operations in the memory system 110, it is to be noted that, as described above, the processor 134 included in the controller 130 may perform command operations in the memory system 110, through, for example, an FTL (flash translation layer). Also, in the embodiment of the present disclosure, the controller 130 programs and stores user data and metadata corresponding to the write commands received from the host 102, in random memory blocks among the plurality of memory blocks included in the memory device 150.

Metadata may include first map data including a logical to physical (L2P) information (hereinafter, referred to as a 'logical information') and second map data including a physical to logical (P2L) information (hereinafter, referred to as a 'physical information'), for data stored in memory blocks in correspondence to a program operation. Also, the metadata may include an information on command data corresponding to a command received from the host 102, an information on a command operation corresponding to the command, an information on the memory blocks of the memory device 150 for which the command operation is to be performed, and an information on map data corresponding to the command operation. In other words, metadata may include all remaining information and data excluding user data corresponding to a command received from the host 102.

That is, in the embodiment of the present disclosure, in the case where the controller 130 receives a plurality of write commands from the host 102, program operations corresponding to the write commands are performed, and user data corresponding to the write commands are written and stored in empty memory blocks, open memory blocks or free memory blocks for which an erase operation has been performed, among the memory blocks of the memory device 150. Also, first map data, including an L2P map table or an L2P map list in which logical information as the mapping information between logical addresses and physical addresses for the user data stored in the memory blocks are recorded, and second map data, including a P2L map table or a P2L map list in which physical information as the mapping information between physical addresses and logical addresses for the memory blocks stored with the user data are recorded, are written and stored in empty memory blocks, open memory blocks or free memory blocks among the memory blocks of the memory device 150.

Here, in the case where write commands are received from the host 102, the controller 130 writes and stores user data corresponding to the write commands in memory blocks, and stores, in memory blocks, metadata including first map data and second map data for the user data stored in the memory blocks. In particular, in correspondence to that the data segments of the user data are stored in the memory blocks of the memory device 150, the controller 130 generates and updates the L2P segments of first map data and the P2L segments of second map data as the map segments of map data among the meta segments of metadata, and then, stores them in the memory blocks of the memory device 150. The map segments stored in the memory blocks of the memory device 150 are loaded in the memory 144 included in the controller 130 and are then updated.

Also, in the memory system in accordance with the embodiment of the present disclosure, as described above, after performing program operations in the memory blocks of the memory device 150, whether the program operations performed in the memory blocks of the memory device 150 have succeeded or failed may be determined. In the memory system in accordance with the embodiment of the present disclosure, in the case where program operations corresponding to a plurality of write commands received from the host 102 are performed in the memory blocks of the memory device 150, by checking, through a current sensing circuit (CSC), program voltage distributions in correspondence to performing of program operations in the memory blocks of the memory device 150, passes or failures of the program voltage distributions are checked. Based on the check, whether the program operations have succeeded or failed may be determined. In particular, in the memory system in accordance with the embodiment of the present disclosure, as program operations are performed in the memory blocks of the memory device 150, a pass or a failure is checked for each of program voltage distributions respectively indicating program states in the memory blocks, and whether the program operations have succeeded or failed may be determined through the passes or failures of the program voltage distributions, thereby reducing the number of additional program operations in the memory blocks of the memory device 150. Hereinbelow, a data processing operation in the memory system in accordance with the embodiment of the present disclosure will be described in detail with reference to FIGS. 5 to 9.

Figure 5:
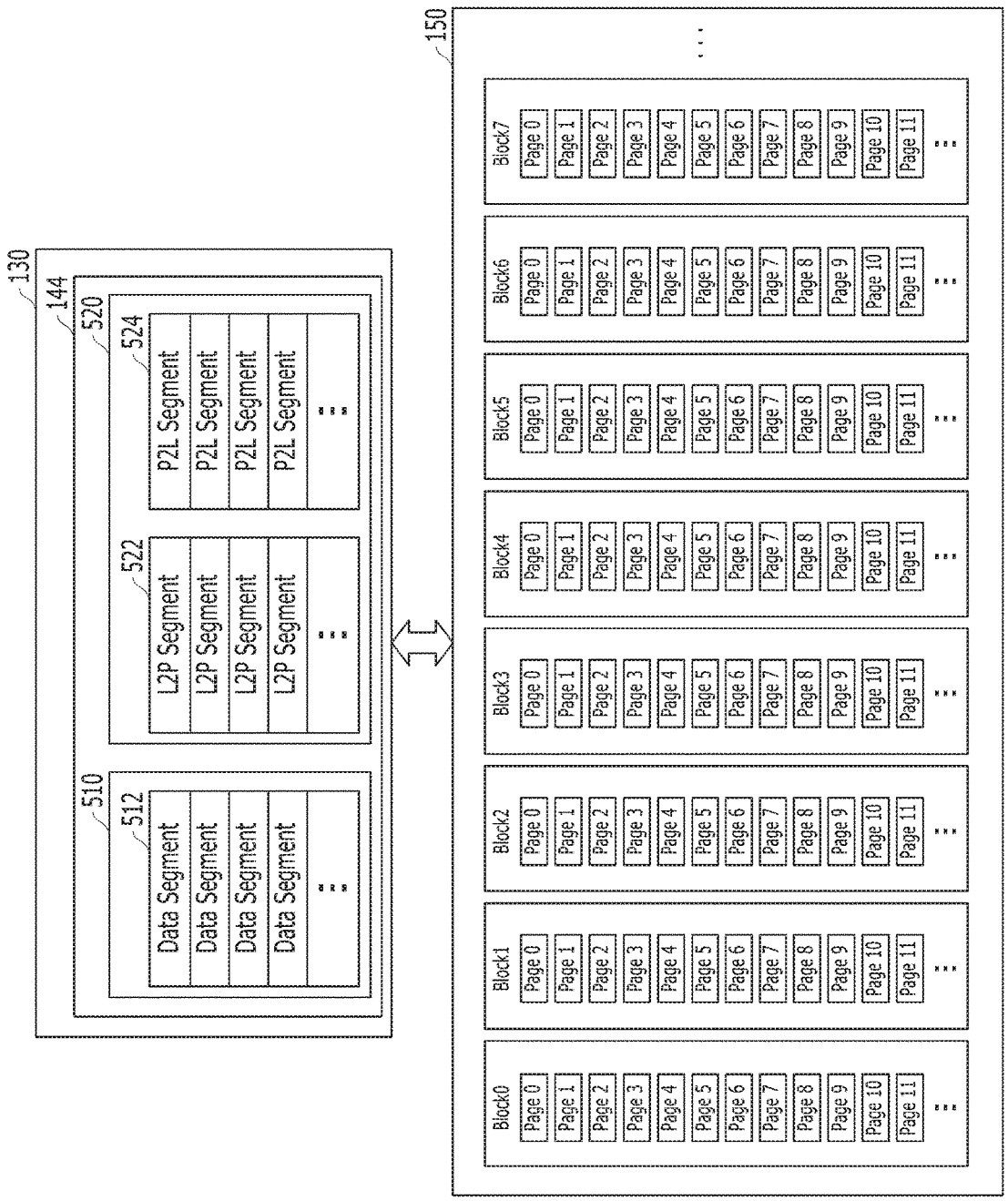
FIGS. 5 to 9 are examples of schematic diagrams to assist in the explanation of a data processing operation in a memory system in accordance with an embodiment.

First, referring to FIG. 5, the controller 130 performs command operations corresponding to a plurality of commands received from the host 102, for example, program operations corresponding to a plurality of write commands received from the host 102. At this time, the controller 130 programs and stores user data corresponding to the write commands, in memory blocks of the memory device 150. Also, in correspondence to the program operations with respect to the memory blocks, the controller 130 generates and updates metadata for the user data and stores the metadata in the memory blocks of the memory device 150.

The controller 130 generates and updates first map data and second map data which include information indicating that the user data are stored in pages included in the memory blocks of the memory device 150. That is, the controller 130 generates and updates L2P segments as the logical segments of the first map data and P2L segments as the physical segments of the second map data, and then stores them in pages included in the memory blocks of the memory device 150.

For example, the controller 130 caches and buffers the user data corresponding to the write commands received from the host 102, in a first buffer 510 included in the memory 144 of the controller 130. In particular, after storing data segments 512 of the user data in the first buffer 510 as a data buffer/cache, the controller 130 stores the data segments 512 stored in the first buffer 510, in pages included in the memory blocks of the memory device 150. As the data segments 512 of the user data corresponding to the write commands received from the host 102 are programmed to and stored in the pages included in the memory blocks of the memory device 150, the controller 130 generates and updates the first map data and the second map data, and stores them in a second buffer 520 included in the memory 144 of the controller 130. In particular, the controller 130 stores L2P segments 522 of the first map data and P2L segments 524 of the second map data for the user data, in the second buffer 520 as a map buffer/cache. In the second buffer 520 in the memory 144 of the controller 130, there may be stored, as described above, the L2P segments 522 of the first map data and the P2L segments 524 of the second map data. Alternatively, there may be stored a map list for the L2P segments 522 of the first map data and a map list for the P2L segments 524 of the second map data. The controller 130 stores the L2P segments 522 of the first map data and the P2L segments 524 of the second map data which are stored in the second buffer 520, in pages included in the memory blocks of the memory device 150.

As described above, in the case of performing program operations in the memory blocks of the memory device 150, the controller 130 determines whether the program operations performed in the memory blocks of the memory device 150 have succeeded or failed. The controller 130 determines whether the program operations have succeeded or failed by receiving from the memory device 150 a result of whether the program operations performed in the memory blocks of the memory device 150 have succeeded or failed, and performs additional program operations for failed program operations, in the memory blocks of the memory device 150. The memory device 150 determines whether the program operations have succeeded or failed, by checking whether program voltage distributions in correspondence to the program operations performed in the memory blocks have passed or failed, and then, transmits a result of the determination, to the controller 130. Determining whether the program operations have succeeded or failed by checking whether each of the program voltage distributions for program states in the memory blocks is a pass or a fail allows the controller 130 to minimize the performance of additional program operations.

Figure 6:
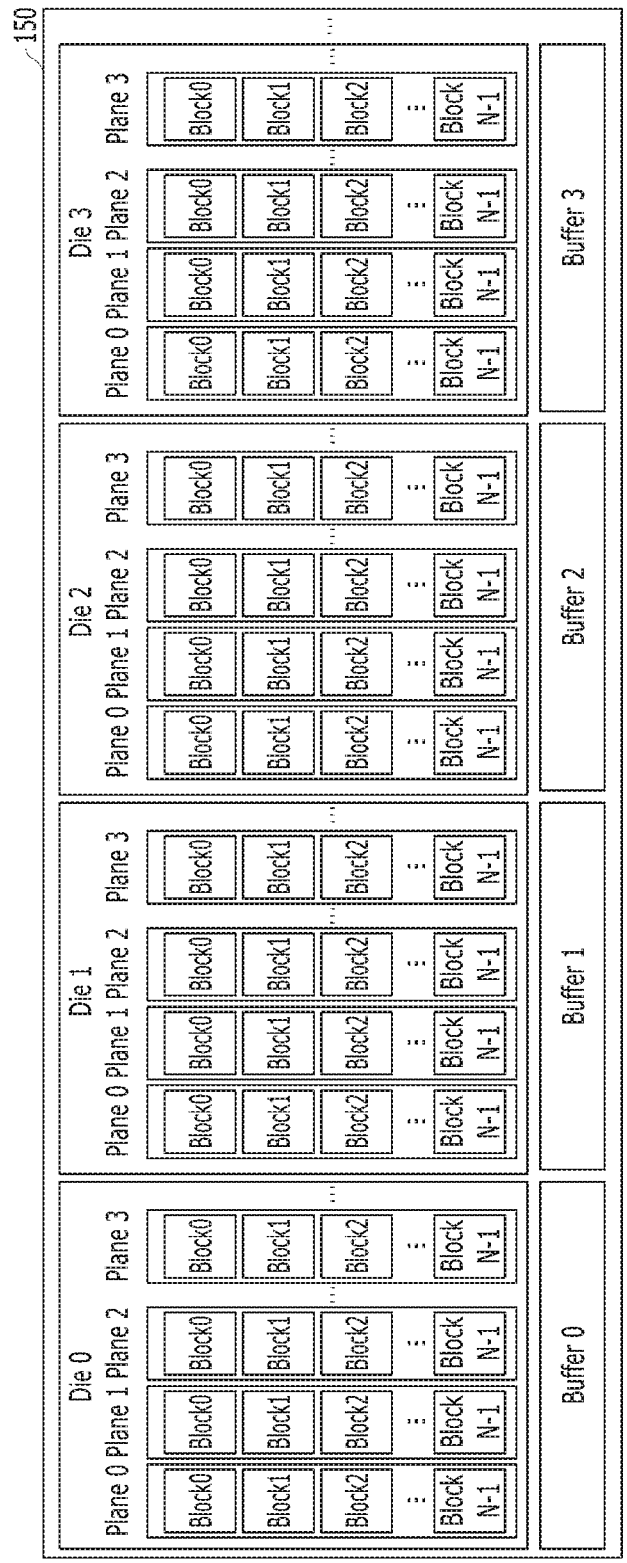

Referring to FIG. 6, the memory device 150 includes a plurality of memory dies, for example, a memory die 0 (denoted as "Die 0"), a memory die 1 (denoted as "Die 1"), a memory die 2 (denoted as "Die 2") and a memory die 3 (denoted as "Die 3"). Each of the memory dies includes a plurality of planes, for example, a plane 0 (denoted as "Plane 0"), a plane 1 (denoted as "Plane 1"), a plane 2 (denoted as "Plane 2") and a plane 3 (denoted as "Plane 3"). The respective planes in the memory dies included in the memory device 150 include a plurality of memory blocks, for example, N number of blocks Block0, Block1, . . . , BlockN-1 each including a plurality of pages, for example, $2^M$ number of pages, as described above with reference to FIG. 2. Moreover, the memory device 150 includes a plurality of buffers corresponding to the respective memory dies, for example, a buffer 0 (denoted as "Buffer 0") corresponding to the memory die 0, a buffer 1 (denoted as "Buffer 1") corresponding to the memory die 1, a buffer 2 (denoted as "Buffer 2") corresponding to the memory die 2 and a buffer 3 (denoted as "Buffer 3") corresponding to the memory die 3.

In the case of performing command operations corresponding to a plurality of commands received from the host 102, data corresponding to the command operations are stored in the buffers included in the memory device 150. For example, in the case of performing program operations, data corresponding to the program operations are stored in the buffers, and are then stored in the pages included in the memory blocks of the memory dies. In the case of performing read operations, data corresponding to the read operations are read from the pages included in the memory blocks of the memory dies, stored in the buffers, and then provided to the host 102 through the controller 130.

Although FIG. 6 illustrates, as an example and for the sake of convenience in explanation, that the buffers included in the memory device 150 of FIG. 6 exist outside the respective corresponding memory dies, it is to be noted that the present invention is not limited in this way. For example, the buffers may exist inside the respective corresponding memory dies. It is also to be noted that the buffers may correspond to the respective planes or the respective memory blocks in the respective memory dies. Further, in the embodiment of the present disclosure, while it is described, as an example and for the sake of convenience in explanation, that the buffers (Buffer 0 to Buffer 3) included in the memory device 150 of FIG. 6 correspond to the plurality of page buffers 322, 324 and 326 included in the memory device 150 as described above with reference to FIG. 3, it is to be noted that the buffers may be a plurality of caches or a plurality of registers included in the memory device 150.

Also, the plurality of memory blocks included in the memory device 150 of FIG. 6 may be grouped into a plurality of super memory blocks, and command operations may be performed in the plurality of super memory blocks. Each of the super memory blocks may include a plurality of memory blocks, for example, memory blocks included in a first memory block group and a second memory block group. In this regard, when the first memory block group is included in the first plane of a certain first memory die, the second memory block group may be included in the first plane of the first memory die, the second plane of the first memory die, or in the planes of a second memory die. Hereinbelow, detailed descriptions will be made with reference to FIGS. 7 to 9, through an example, for determining whether the program operations performed in the memory blocks have succeeded or faded in the case of performing program operations in the memory blocks of the memory device 150 in the memory system in accordance with the embodiment of the present disclosure.

When the controller 130 performs program operations in the memory blocks of the memory device 150, data bits are programmed in the memory cells which are realized in the pages of the memory blocks. For example, in order to program k data bits in one memory cell, any one of $2^k$ threshold voltages is formed in the memory cell. Due to minute differences in electrical characteristics between memory cells, the threshold voltages of memory cells which are programmed with the same data form a certain range of threshold voltage distribution. Each threshold voltage distribution corresponds to each of $2^k$ data values which may be generated by the k data bits. Since a voltage window in which the threshold voltage distributions may be disposed is limited, as the data bit number k increases, the distance between adjacent threshold voltage distributions decreases. Accordingly, adjacent threshold voltage distributions may overlap with one another. As adjacent threshold voltage distributions overlap in this way, a number of error bits may be included.

Figure 7:
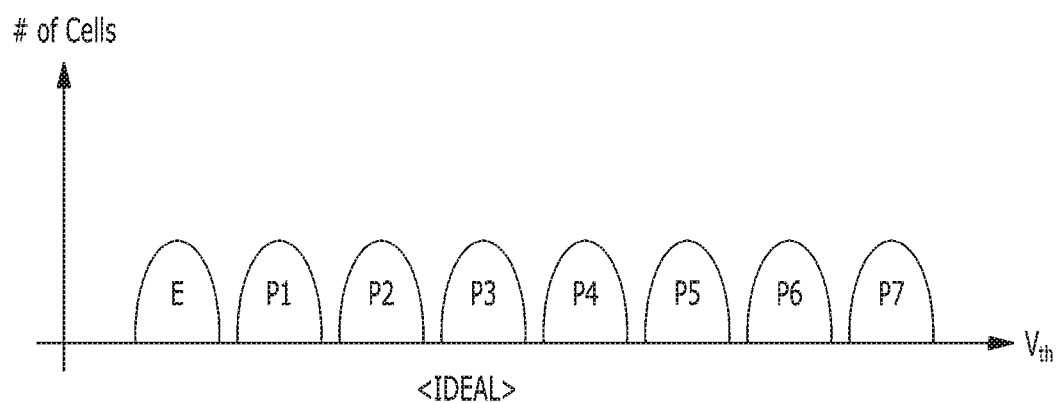
Figure 8:
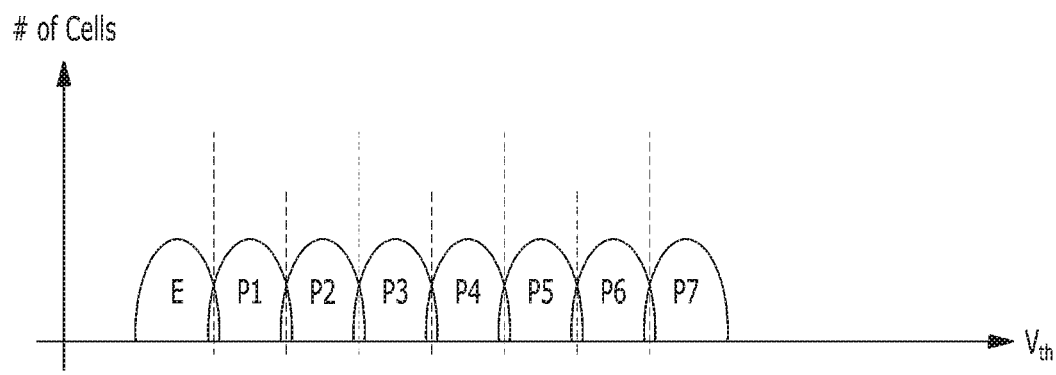

Threshold voltage distributions in triple level cell (TLC) memory blocks may have ideal threshold voltage distributions which do not overlap at all with one another, as shown in FIG. 7, or may have threshold voltage distributions which move, shift, or become deformed and thus overlap with one another due to the characteristic degradations of memory cells, as shown in FIG. 8. For instance, ideal threshold voltage distributions indicating program states and an erase state of the triple level cell memory blocks are represented in FIG. 7. However, as characteristic degradations occur in memory cells, threshold voltage distributions indicating program states and an erase state may be represented by adjacent threshold voltage distributions overlapping with one another, as shown in FIG. 8. In detail, in the case of programming three data bits (that is, k=3) in a single memory cell included in triple level cell memory blocks, any one threshold voltage distribution among $2^3$ (that is, eight) threshold voltage distributions is formed in the single memory cell. Due to minute differences in electrical characteristics between a plurality of memory cells, the threshold voltages of memory cells which are programmed with the same data form a certain range of threshold voltage distribution. For example, in triple level cell memory blocks, threshold voltage distributions P1, P2, P3, P4, P5, P6 and P7 corresponding to seven program states and a threshold voltage distribution E corresponding to one erase state are formed.

When threshold voltage distributions in the memory blocks of the memory device 150 have the threshold voltage distributions which overlap with one another, as shown in FIG. 8, a number of error bits may be included. When program voltage distributions respectively indicating program states in the memory blocks have the threshold voltage distributions which overlap with one another, after program operations are determined to have failed due to the presence of the number of error bits, additional program operations need to be performed for the program operations that failed in the memory blocks. In the memory system in accordance with the embodiment of the present disclosure, when program operations corresponding to a plurality of write commands received from the host 102 are performed in the memory blocks of the memory device 150, program voltage distributions in correspondence to the performance of the program operations in the memory blocks of the memory device 150 are checked through a current sensing circuit. In particular, in the embodiment of the present disclosure, when program voltage distributions corresponding to the performance of the program operations have the threshold voltage distributions shown in FIG. 7 or FIG. 8, whether the respective program voltage distributions have passed or failed are checked through the current sensing circuit, and thereby, whether the program operations performed in the memory blocks of the memory device 150 have succeeded or failed may be determined. Hereinbelow, an operation of determining whether program operations have succeeded or failed in the memory system in accordance with the embodiment of the present disclosure will be described below in detail with reference to FIG. 9.

Figure 9:
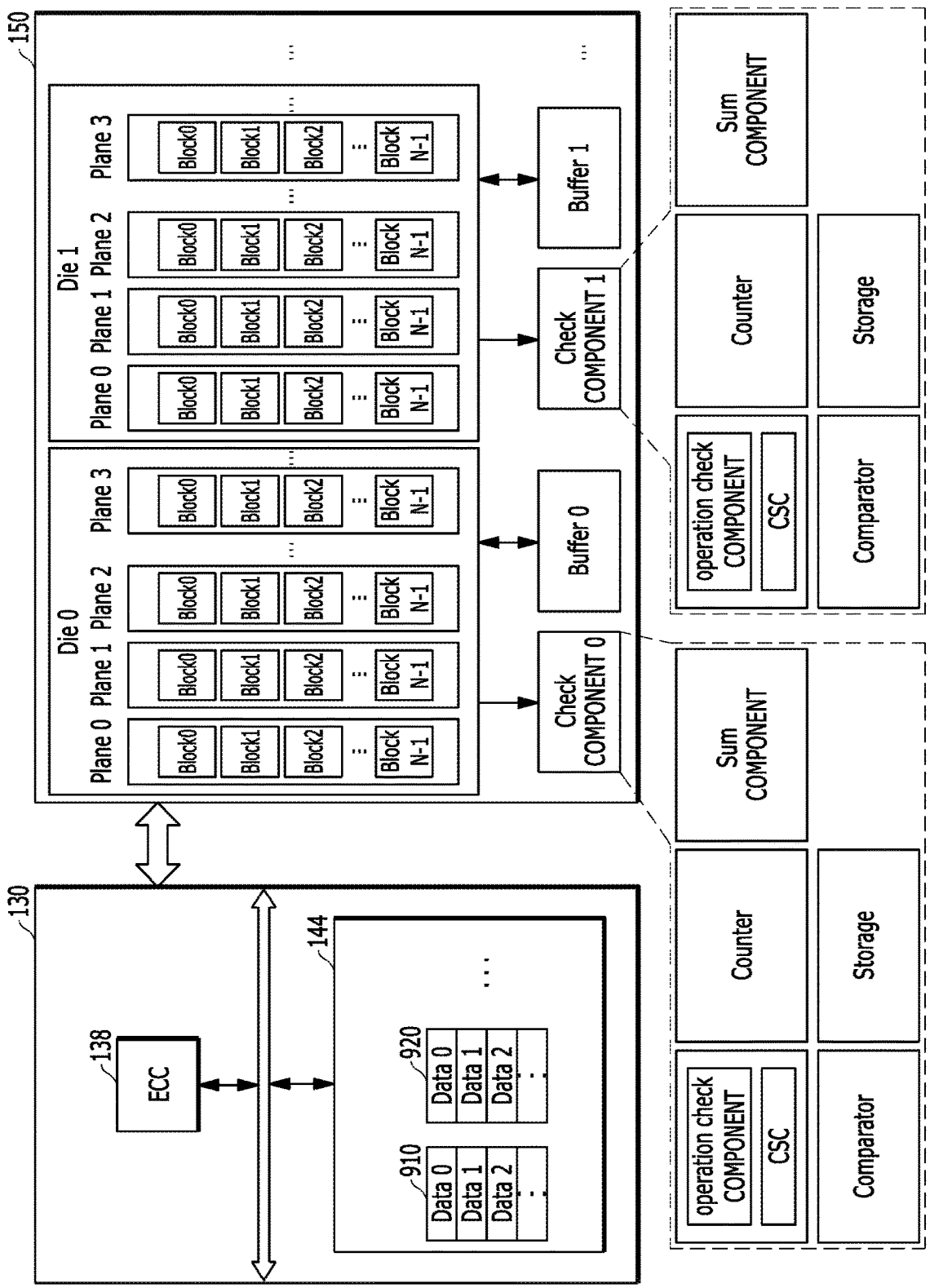

Referring to FIG. 9, the controller 130 stores data corresponding to a plurality of write commands received from a host (for example, the host 102 shown in FIG. 1), in the memory 144 of the controller 130, and then, programs and stores the data stored in the memory 144, in the memory blocks included in the memory dies of the memory device 150. The controller 130 programs first data 910 stored in the memory 144, in the memory blocks included in a memory die 0 of the memory device 150 through a buffer 0, and programs second data 920 stored in the memory 144, in the memory blocks included in a memory die 1 of the memory device 150 through a buffer 1. Further, the controller 130 reads data corresponding to a plurality of read commands received from the host 102, from the memory blocks included in the memory dies of the memory device 150, stores the read data in the memory 144 of the controller 130, and then provides the data to the host 102. The controller 130 reads data from the memory blocks included in the memory die 0 of the memory device 150 through the buffer 0 and stores the read data in the memory 144, and reads data from the memory blocks included in the memory die 1 of the memory device 150 through the buffer 1 and stores the read data in the memory 144. After correcting an error bit of first data 910 and second data 920 stored in the memory 144, through the ECC component 138, the controller 130 provides error-corrected data to the host 102.

In particular, after programming and storing the first data 910 and the second data 920 stored in the memory 144, in the memory blocks included in the memory die 0 and the memory die respectively, of the memory device 150, the controller 130 determines whether the program operations performed in the memory blocks have succeeded or failed. For instance, after programming and storing the first data 910 stored in the memory 144, in the memory blocks of the memory die 0, the controller 130 receives check results indicating whether the program operations performed in the memory blocks of the memory die 0 have succeeded or failed, from the memory device 150. The memory device 150 checks threshold voltage distributions in the memory blocks of the memory die 0 in which the program operations are performed for the first data 910, through a check component 0, and, after determining whether the program operations have succeeded or failed, by checking whether program voltage distributions in correspondence to the threshold voltage distributions have passed or failed, transmits the check results indicating whether the program operations have succeeded or failed, to the controller 130. Also, after programming and storing the second data 920 stored in the memory 144, in the memory blocks of the memory die 1, the controller 130 receives check results indicating whether the program operations performed in the memory blocks of the memory die 1 have succeeded or failed, from the memory device 150. The memory device 150 checks threshold voltage distributions in the memory blocks of the memory die 1 in which the program operations are performed for the second data 920, through a check component 1, and, after determining whether the program operations have succeeded or failed, by checking whether program voltage distributions in correspondence to the threshold voltage distributions have passed or failed, transmits the check results indicating whether the program operations have succeeded or failed, to the controller 130.

In the embodiment of the present disclosure, while it is described, as an example and for the sake of convenience in explanation, that the check components (for example, check component 0, check component 1, . . . ) correspond to the memory dies (for example, memory die 0, memory die 1, . . . ), respectively, included in the memory device 150, it is to be noted that the check components may alternatively correspond to an entire memory cell array included in the memory device 150, or it is to be noted that the check components may correspond to the planes (for example, plane 0, plane 1, plane 3, . . . ), respectively, included in the memory dies or correspond to the memory blocks (for example, memory blocks BLOCK0 to BLOCKN-1), respectively, included in the planes. Also, although FIG. 9 illustrates, as an example and for the sake of convenience in explanation, that the check components exist inside the memory device 150 and outside the memory dies, it is to be noted that check components may exist outside the memory device 150 or inside the memory dies. Alternatively, the check components may also exist inside the controller 130.

Each of check components includes an operation check component which checks an operation state in a memory cell array of the memory device 150 or respective memory dies, a counter which counts fail bits checked through the operation check component, a sum component which sums the numbers of fail bits counted through the counter, a comparator which compares the summed number of fail bits with a threshold, and a storage which stores the numbers of fail bits, the summed number of fail bits, the threshold, etc. The operation check component includes a current sensing circuit. By checking threshold voltage distributions in the memory cell array through the current sensing circuit, the operation check component checks program voltage distributions in memory blocks in which program operations are performed, and generates signals which indicate whether the program voltage distributions have passed or failed in the memory blocks in which the program operations are performed. The counter counts memory cells of which program voltage distributions have failed, among the program voltage distributions that have passed or failed checked through the operation check component. Thus, the counter counts fail bits in the program voltage distributions checked through the operation check component. The sum component sums the numbers of fail bits counted through the counter. In particular, the sum component sums the numbers of fail bits for each of optional page groups. The comparator compares the number of fail bits with a threshold. In particular, after comparing the summed number of fail bits with the threshold, the comparator transmits signals (i.e., check results) indicating whether the program operations have succeeded or failed, to the controller 130 depending on comparison results. The storage stores the numbers of fail bits, the summed number of fail bits, the threshold, signal values for the program voltage distributions that have passed or failed checked by the operation check component, and signal values for the program operations that have succeeded or failed checked by the comparator. The storage may be included in the buffers of the memory device 150. In particular, the storage may be included in buffers which are implemented as registers in the memory device 150. In the embodiment of the present disclosure, for the sake of convenience in explanation, it will be described below in detail as an example that, when program operations are performed in the triple level cell memory blocks included in the memory device 150, the passes or failures of the program voltage distributions having the threshold voltage distributions of FIGS. 7 and 8 are checked and then the successes or failures of the program operations are determined.

For example, after performing program operations in the memory blocks of the memory device 150, each of check component checks threshold voltage distributions in the memory blocks in which the program operations are performed, as program voltage distributions. The check component checks whether the highest level program voltage distribution P7 in the program voltage distributions have passed or failed. In particular, after checking a pass or a failure for the highest level program voltage distribution P7, and if the highest level program voltage distribution P7 is a pass, the check component checks whether the remaining program voltage distributions P1, P2, P3, P4, P5 and P6 have passed or failed. If, however, the highest level program voltage distribution P7 is a failure, the check component transmits a signal indicating that all the program operations performed in the memory blocks of the memory device 150 have failed, for example, a program fail status signal, to the controller 130.

Also, when the highest level program voltage distribution P7 and the remaining program voltage distributions P1, P2, P3, P4, P5 and P6, that is, all the program voltage distributions P1, P2, P3, P4, P5, P6 and P7, are passes, the check component transmits a signal indicating that the program operations performed in the memory blocks of the memory device 150 have succeeded, to the controller 130. When all the program voltage distributions P1, P2, P3, P4, P5, P6 and P7 are passes, the check components transmits a signal indicating that all the program operations performed in the memory blocks of the memory device 150 have normally succeeded, for example, a fully successful program status signal, to the controller 130.

When the highest level program voltage distribution P7 is a pass but one or more program voltage distributions among the remaining program voltage distributions P1, P2, P3, P4, P5 and P6 is a fail, the check component checks fail bits for program voltage distributions in which failures have occurred, and counts fail bits in the program voltage distributions P1, P2, P3, P4, P5, P6 and P7. In the memory system in accordance with the embodiment of the present disclosure, when a program voltage distribution in which at least one failure has occurred exists among all the program voltage distributions P1, P2, P3, P4, P5, P6 and P7, additional program operations are not performed for a predetermined maximum loop until all the program voltage distributions P1, P2, P3, P4, P5, P6 and P7 have passed, and fail bits are checked in all the program voltage distributions P1, P2, P3, P4, P5, P6 and P7. Therefore, by reducing the number of additional program operations, the characteristic degradations of memory cells may be reduced and an operating speed may be increased. Furthermore, by reducing a string stress in the word lines of the memory device 150, the reliability of the memory device 150 may be improved.

Namely, when a program voltage distribution in which at least one failure has occurred exists among all the program voltage distributions P1, P2, P3, P4, P5, P6 and P7, the check component checks and counts first fail bits in the first program voltage distribution P1, checks and counts second fail bits in the second program voltage distribution P2, checks and counts third fail bits in the third program voltage distribution P3, checks and counts fourth fail bits in the fourth program voltage distribution P4, checks and counts fifth fail bits in the fifth program voltage distribution P5, checks and counts sixth fail bits in the sixth program voltage distribution P6, and checks and counts seventh fail bits in the seventh program voltage distribution P7.

The check component sums the numbers of fail bits counted in all the program voltage distributions P1, P2, P3, P4, P5, P6 and P7. The check component sums the numbers of fail bits in all the program voltage distributions P1, P2, P3, P4, P5, P6 and P7, for each of program voltage distribution groups. The check component sums the numbers of fail bits for each of program voltage distribution groups, in correspondence to the memory blocks included in the memory device 150. In particular, the check component sums the numbers of fail bits for a single program voltage distribution group or multiple is program voltage distribution groups (e.g., a single program voltage distribution group in a single level cell memory block, two program voltage distribution groups in a multi-level cell memory block, three program voltage distribution groups in a triple level cell memory block and four program voltage distribution groups in a quad level cell memory block), in correspondence to memory blocks each of which stores 1 bit or at least 2 bits in each memory cell.

For example, the check component sums the numbers of fail bits of the program voltage distributions P3 and P7 included in a first program voltage distribution group, sums the numbers of fail bits of the program voltage distributions P2, P4 and P6 included in a second program voltage distribution group, and sums the numbers of fail bits of the program voltage distributions P1 and P5 included in a third program voltage distribution group. The first program voltage distribution group includes the program voltage distributions P3 and P7 corresponding to least significant bit (LSB) pages in the memory blocks of the memory device 150 in which the program operations are performed, the second program voltage distribution group includes the program voltage distributions P2, P4 and P6 corresponding to central significant bit (CSB) pages in the memory blocks of the memory device 150 in which the program operations are performed, and the third program voltage distribution group includes the program voltage distributions P1 and P5 corresponding to most significant bit (MSB) pages in the memory blocks of the memory device 150 in which the program operations are performed. That is, the check component sums a third fail bit number obtained by counting the third fail bits in the third program voltage distribution P3 and a seventh fail bit number obtained by counting the seventh fail bits in the seventh program voltage distribution P7, in correspondence to LSB pages in the memory blocks. The check component sums a second fail bit number obtained by counting the second fail bits in the second program voltage distribution P2, a fourth fail bit number obtained by counting the fourth fail bits in the fourth program voltage distribution P4 and a sixth fail bit number obtained by counting the sixth fail bits in the sixth program voltage distribution P6, in correspondence to CSB pages in the memory blocks. Further, the check component sums a first fail bit number obtained by counting the first fail bits in the first program voltage distribution P1 and a fifth fail bit number obtained by counting the fifth fail bits in the fifth program voltage distribution P5, in correspondence to MSB pages in the memory blocks.

The check component compares the numbers of fail bits counted in the respective first to third program voltage distribution groups P3 and P7 and P2, P4 and P6 and P1 and P5 with a threshold. In particular, the check component compares a summed bit number for each of the program voltage distribution groups in all the program voltage distributions P1, P2, P3, P4, P5, P6 and P7 and the threshold, and then, based on a comparison result, transmits a signal indicating the program operations performed in the memory blocks of the is memory device 150 have succeeded or failed, to the controller 130. The check component compares a first summed bit number obtained by summing the third fail bit number and the seventh fail bit number of the first program voltage distribution group and the threshold, compares a second summed bit number obtained by summing the second fail bit number, the fourth fail bit number and the sixth fail bit number of the second program voltage distribution group and the threshold, and compares a third summed bit number obtained by summing the first fail bit number and the fifth fail bit number of the third program voltage distribution group and the threshold. The threshold may be determined in correspondence to the maximum error-correction capability of the ECC component 138. The threshold may be determined in the controller 130 or the check component and be then stored in the storage. When the threshold is determined in the controller 130, it may be determined in the processor 134 or the ECC component 138.

In the case where, as a result of comparing the first summed bit number and the threshold, comparing the second summed bit number and the threshold and comparing the third summed bit number and the threshold, at least one summed bit number exceeds the threshold, the check component transmits a signal indicating that all the program operations performed in the memory blocks of the memory device 150 have failed, for example, a program fail status signal, to the controller 130. In a program voltage distribution group in which a summed bit number exceeds the threshold (hereinafter, referred to as a 'failed program voltage distribution group'), program voltage distributions which have a greater number of error bits than the threshold are included. The error bits included in the failed program voltage distribution group exceed the maximum error-correction capability of the ECC component 138. In other words, because error bits exceeding the maximum error-correction capability of the ECC component 138 are programmed in pages corresponding to the failed program voltage distribution group in the memory blocks, the check component transmits the program fail status signal to the controller 130.

When, as a result of comparing the first summed bit number and the threshold, comparing the second summed bit number and the threshold and comparing the third summed bit number and the threshold, all the respective summed bit numbers are smaller than the threshold, the check component transmits a signal indicating that the program operations performed in the memory blocks of the memory device 150 have partially succeeded, for example, a partially successful program status signal, to the controller 130. In a program voltage distribution group in which a summed bit number is smaller than the threshold (hereinafter, referred to as a 'partially successful program voltage distribution group'), program voltage distributions which have a lesser number of error bits than the threshold are included. The error bits included in the partially successful program is voltage distribution group are within the maximum error-correction capability of the ECC component 138. In other words, because error bits within the maximum error-correction capability of the ECC component 138 are programmed in pages corresponding to the partially successful program voltage distribution group in the memory blocks, the check component transmits the partially successful program status signal to the controller 130.

When the program fail status signal is received from each of the check components of the memory device 150, the controller 130 confirms that all the program operations performed in the memory blocks of the memory device 150 have failed, and performs again program operations for the failed program operations or transmits a signal indicating a failure to the host 102 as a response to the write commands received from the host 102. When the fully successful program status signal is received from each of the check components of the memory device 150, the controller 130 confirms that all the program operations performed in the memory blocks of the memory device 150 have succeeded, transmits a signal indicating a success to the host 102 as a response to the write commands received from the host 102, and performs command operations corresponding to other commands received from the host 102.

When the partially successful program status signal is received from each of the check components of the memory device 150, the controller 130 confirms that the program operations performed in the is memory blocks of the memory device 150 have partially succeeded, and transmits a signal indicating a success to the host 102 as a response to the write commands received from the host 102. Further, in correspondence to the partially successful program status signal received from each of the check components of the memory device 150, the controller 130 performs a copy operation for data corresponding to partially successful program operations (hereinafter, referred to as 'partially successful program data') in the memory blocks of the memory device 150. The controller 130 identifies pages corresponding to the partially successful program voltage distribution group in the memory blocks of the memory device 150, reads the partially successful program data stored in the pages of the partially successful program voltage distribution group, and stores the read partially successful program data in the memory blocks of the memory device 150. In this regard, the controller 130 stores the read partially successful program data in the memory 144 of the controller 130, performs an error correction operation through the ECC component 138, and stores the error-corrected partially successful program data in the memory blocks of the memory device 150.

When the pages of the partially successful program voltage distribution group are first LSB pages, first CSB pages and first MSB pages of a first memory block, the controller 130 stores the partially successful program data stored in the first LSB pages, the first CSB pages and the first MSB pages, in second LSB pages, second CSB pages and second MSB pages of the first memory block or in first LSB pages, first CSB pages and first MSB pages of a second memory block. When the pages of the partially successful program voltage distribution group are first LSB pages, first CSB pages and first MSB pages of a first memory block, the controller 130 stores the partially successful program data stored in specific pages among the first LSB pages, the first CSB pages and the first MSB pages, for example, the first MSB pages, in second MSB pages of the first memory block or in first MSB pages of a second memory block. The specific pages among the first LSB pages, the first CSB pages and the first MSB pages of the first memory block may be pages in which fail bits are included, and the remaining pages may be pages in which fail bits are not included. Namely, the controller 130 performs a copy operation for the entirety of the partially successful program data or performs a copy operation for partial data of the partially successful program data, in which fail bits are included. Hereinbelow, an operation of processing data in a memory system in accordance with an embodiment of the present disclosure will be described in detail with reference to FIG. 10.

Figure 10:
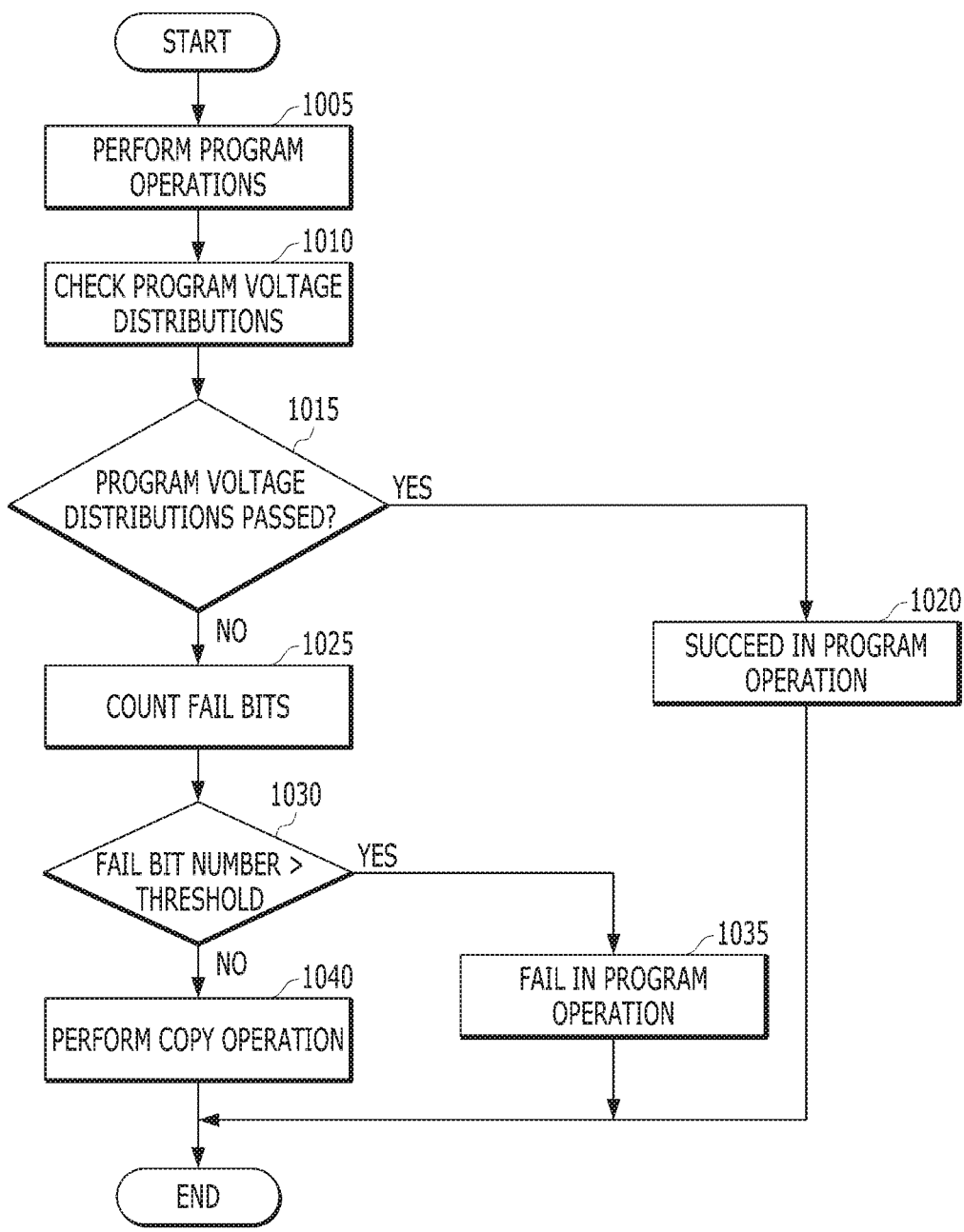
FIG. 10 is a schematic flow chart describing an operation process for processing data in a memory system in accordance with an embodiment.

FIG. 10 is a schematic flow chart describing an operation process of processing data in the memory system 110 in accordance with an embodiment.

Referring to FIG. 10, at step 1005, the memory system 110 performs program operations corresponding to a plurality of write commands received from the host 102, in the memory blocks of the memory device 150.

The memory system 110 checks, at step 1010, program voltage distributions for the program operations performed in the memory blocks of the memory device 150, and checks, at step 1015, whether the program voltage distributions have passed or failed.

When, all the program voltage distributions are passes as a result of checking whether the program voltage distributions have passed or failed (that is, "YES" at step 1015), the memory system 110 confirms, at step 1020, that all the program operations performed in the memory blocks of the memory device 150 have succeeded, and the operation may end.

When, at least one or more failures have occurred in program voltage distributions, at step 1025 as a result of checking whether the program voltage distributions have passed or failed (that is, "NO" at step S1015), the memory system 110 checks fail bits in the program voltage distributions and counts the fail bits.

Then, at step 1030, the memory system 110 compares a counted fail bit number and a threshold, in particular, sums fail bit numbers in the program voltage distributions for each of the program voltage distribution groups and then compares summed fail bit numbers to the threshold.

When a fail bit number in each of the program voltage distribution groups, in particular, a summed fail bit number exceeds the threshold (that is "YES" at step S1030), the memory system 110 confirms, at step 1035, that all the program operations performed in the memory blocks of the memory device 150 have failed, and the operation may end.

When a fail bit number in each of the program voltage distribution groups, in particular, a summed fail bit number is smaller than or equal the threshold (that is, "NO" at step S1030), the memory system 110 confirms, at step 1040, that the program operations performed in the memory blocks of the memory device 150 have partially succeeded, and performs a copy operation for the partially successful program data.

Since detailed descriptions were made above with reference to FIGS. 5 to 9, for, in the case of performing program operations corresponding to a plurality of write commands received from the host 102 in the memory blocks of the memory device 150, checking whether each of program voltage distributions have passed or failed according to the performance of the program operations, determining of whether the program operations performed in the memory blocks of the memory device 150 have succeeded or failed, through check of a pass or a failure for each of the program voltage distributions, and performing of additional program operations depending on whether the program operations have succeeded or failed, further descriptions thereof will be omitted herein. Hereinbelow, detailed descriptions will be made with reference to FIGS. 11 to 19, for a data processing system and electronic apparatuses to which the memory system 110 including the memory device 150 and the controller 130 described above with reference to FIGS. 1 to 10, in accordance with the embodiment, is applied.

FIGS. 11 to 19 are diagrams schematically illustrating application examples of the data processing system of FIG. 1.

Figure 11:
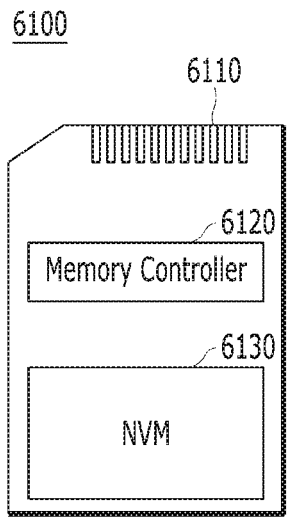
FIGS. 11 to 19 are diagrams schematically illustrating application examples of the data processing system shown in FIG. 1 in accordance with various embodiments of the present invention.

FIG. 11 is a diagram schematically illustrating another example of the data processing system including the memory system in accordance with the present embodiment. FIG. 11 schematically illustrates a memory card system to which the memory system in accordance with the present embodiment is applied.

Referring to FIG. 11, the memory card system 6100 may include a memory controller 6120, a memory device 6130 and a connector 6110.

More specifically, the memory controller 6120 may be connected to the memory device 6130 embodied by a nonvolatile memory, and configured to access the memory device 6130. For example, the memory controller 6120 may be configured to control read, write, erase and background operations of the memory device 6130. The memory controller 6120 may be configured to provide an interface between the memory device 6130 and a host, and drive firmware for controlling the memory device 6130. That is, the memory controller 6120 may correspond to the controller 130 of the is memory system 110 described with reference to FIGS. 1 and 5, and the memory device 6130 may correspond to the memory device 6130 of the memory system 110 described with reference to FIGS. 1 and 5.

Thus, the memory controller 6120 may include a RAM, a processor, a host interface, a memory interface and an error correction component. The memory controller 130 may further include the elements shown in FIG. 5.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with the present embodiment may be applied to wired/wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 5.

The memory controller 6120 and the memory device 6130 may be integrated into a single semiconductor device. For example, the memory controller 6120 and the memory device 6130 may construct a solid state driver (SSD) by being integrated into a single semiconductor device. Also, the memory controller 6120 and the memory device 6130 may construct a memory card such as a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 12:
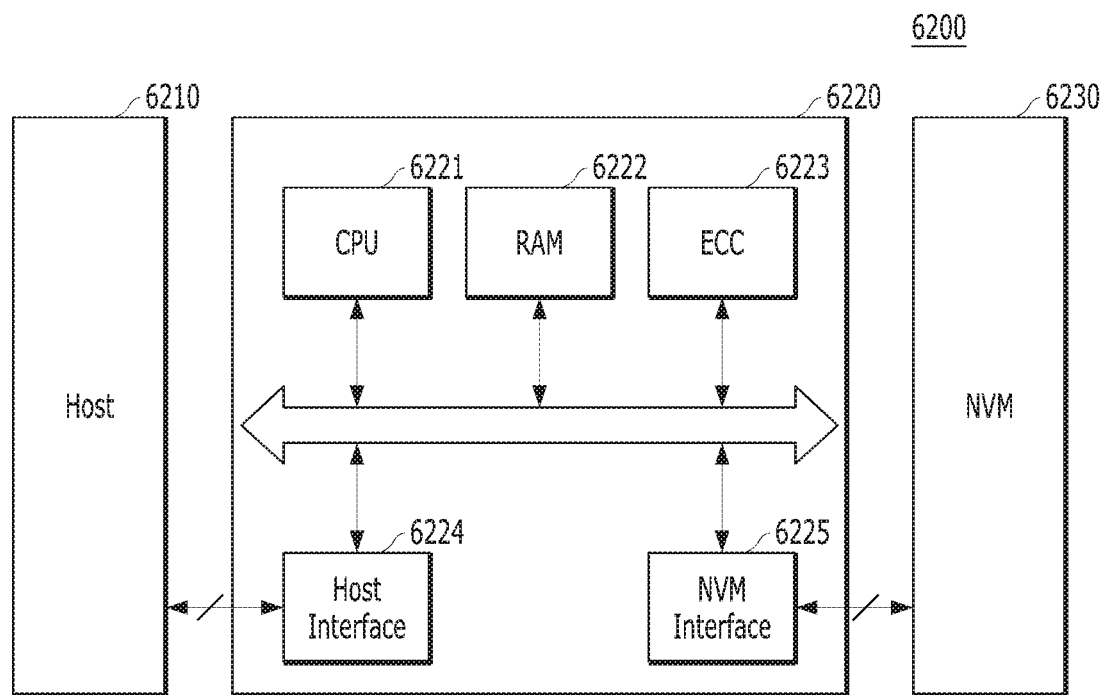

FIG. 12 is a diagram schematically illustrating another example of the data processing system including the memory system in accordance with the present embodiment.

Referring to FIG. 12, the data processing system 6200 may include a memory device 6230 having one or more nonvolatile memories and a memory controller 6220 for controlling the memory device 6230. The data processing system 6200 illustrated in FIG. 12 may serve as a storage medium such as a memory card (CF, SD, micro-SD or the like) or USB device, as described with reference to FIG. 1. The memory device 6230 may correspond to the memory device 150 in the memory system 110 illustrated in FIGS. 1 and 5, and the memory controller 6220 may correspond to the controller 130 in the memory system 110 illustrated in FIGS. 1 and 5.

The memory controller 6220 may control a read, write or erase operation on the memory device 6230 in response to a request of the host 6210, and the memory controller 6220 may include one or more CPUs 6221, a buffer memory such as RAM 6222, an ECC circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC component 138 of the controller 130 illustrated in FIG. 1. As described with reference to FIG. 1, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. At this time, the ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224, and transmit/receive data to/from the memory device 6230 through the NVM interface 6225. The host interface 6224 may be connected to the host 6210 through a PATA bus, SATA bus, SCSI, USB, PCIe or NAND interface. The memory controller 6220 may have a wireless communication function with a mobile communication protocol such as WiFi or Long Term Evolution (LTE), The memory controller 6220 may be connected to an external device, for example, the host 6210 or another external device, and then transmit/receive data to/from the external device. In particular, as the memory controller 6220 is configured to communicate with the external device through one or more of various communication protocols, the memory system and the data processing system in accordance with the present embodiment may be applied to wired/wireless electronic devices or particularly a mobile electronic device.

Figure 13:
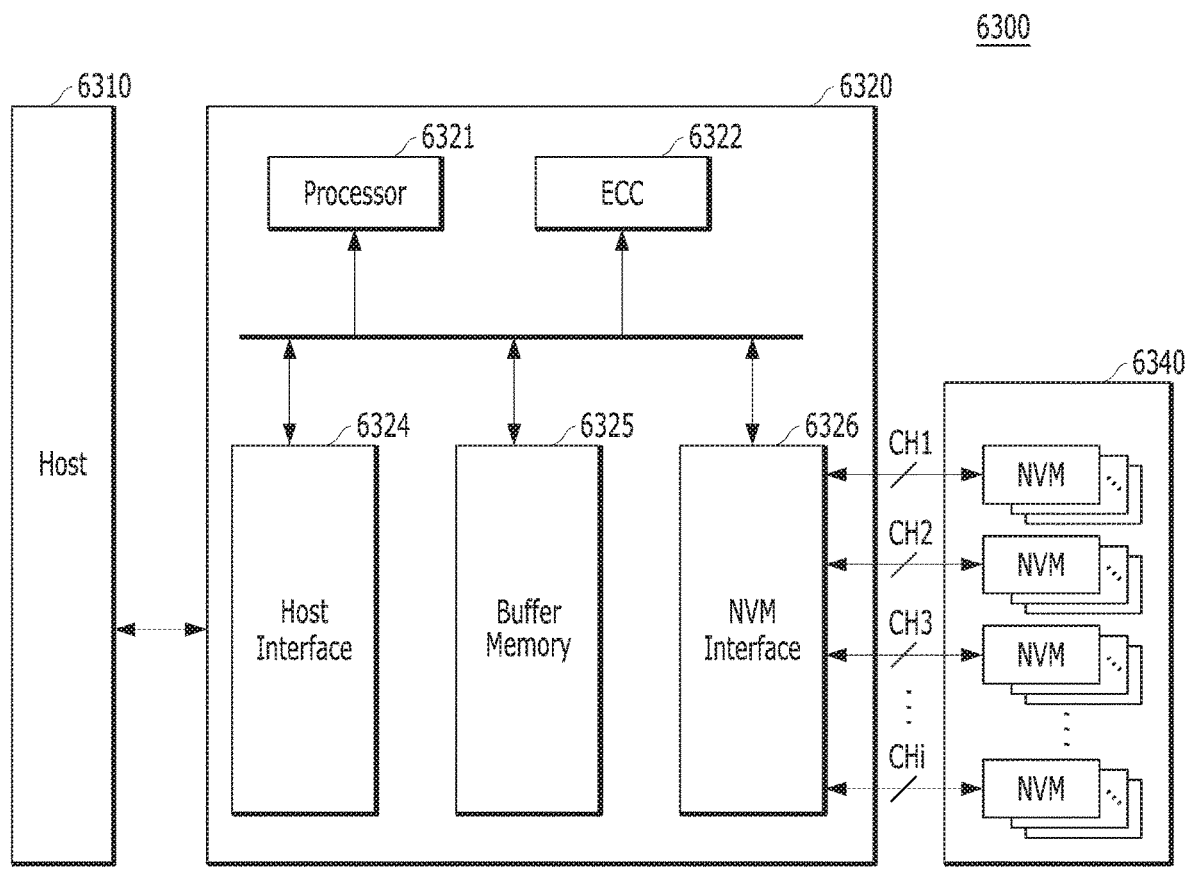

FIG. 13 is a diagram schematically illustrating another example of the data processing system including the memory system in accordance with the present embodiment. FIG. 13 schematically illustrates an SSD to which the memory system in accordance with the present embodiment is applied.

Referring to FIG. 13, the SSD 6300 may include a controller 6320 and a memory device 6340 including a plurality of nonvolatile memories. The controller 6320 may correspond to the controller 130 in the memory system 110 of FIGS. 1 and 5, and the memory device 6340 may correspond to the memory device 150 in the memory system of FIGS. 1 and 5.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM and GRAM or nonvolatile memories such as FRAM, ReRAM, STT-MRAM and PRAM. For convenience of description, FIG. 12 illustrates that the buffer memory 6325 exists in the controller 6320. However, the buffer memory 6325 may exist outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIGS. 1 and 5 is applied may be provided to embody a data processing system, for example, RAID (Redundant Array of Independent Disks) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 14:
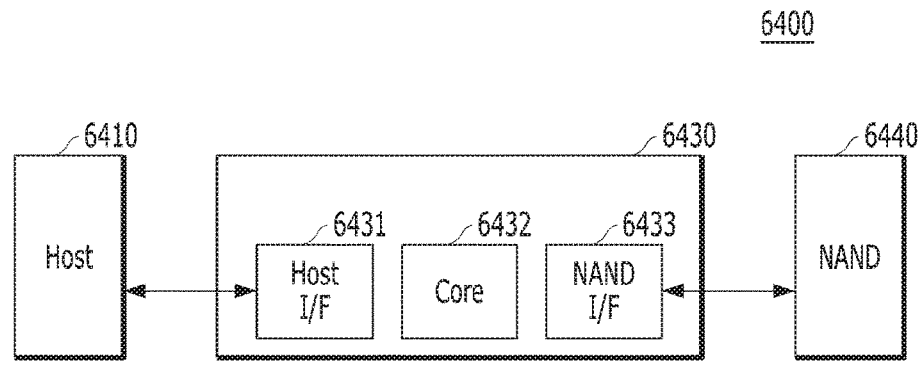

FIG. 14 is a diagram schematically illustrating another example of the data processing system including the memory system in accordance with the present embodiment. FIG. 14 schematically illustrates an embedded Multi-Media Card (eMMC) to which the memory system in accordance with the present embodiment is applied.

Referring to FIG. 14, the eMMC 6400 may include a controller 6430 and a memory device 6440 embodied by one or more NAND flash memories. The controller 6430 may correspond to the controller 130 in the memory system 110 of FIGS. 1 and 5, and the memory device 6440 may correspond to the memory device 150 in the memory system 110 of FIGS. 1 and 5.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, UHS ((Ultra High Speed)-I/UHS-II) interface.

FIGS. 15 to 18 are diagrams schematically illustrating other examples of the data processing system including the memory system in accordance with the present embodiment. FIGS. 15 to 18 schematically illustrate UFS (Universal Flash Storage) systems to which the memory system in accordance with the present embodiment is applied.

Referring to FIGS. 15 to 18, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may is serve as application processors of wired/wireless electronic devices or particularly mobile electronic devices, the UFS devices 6520, 6620, 6720 and 6820 may serve as embedded UFS devices, and the UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired/wireless electronic devices or particularly mobile electronic devices through UFS protocols, and the UFS devices 6520, 6620, 6720 and 6820 and the UFS cards 6530, 6630, 6730 and 6830 may be embodied by the memory system 110 illustrated in FIGS. 1 and 5. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 12 to 14, and the UFS cards 6530, 6630, 6730 and 6830 may be embodied in the form of the memory card system 6100 described with reference to FIG. 11.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI UniPro (Unified Protocol) in MIPI (Mobile is Industry Processor Interface). Furthermore, the UFS devices 6520, 6620, 6720 and 6820 and the UFS cards 6530, 6630, 6730 and 6830 may communicate with each other through various protocols other than the UFS protocol, for example, UFDs, MMC, SD, mini-SD, and micro-SD.

Figure 15:
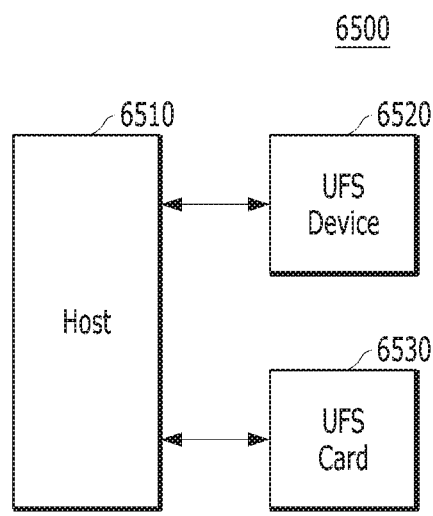

In the UFS system 6500 illustrated in FIG. 15, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. At this time, the UFS device 6520 and the UFS card 6530 may communicate with each other through link layer switching at the UniPro of the host 6510. In the present embodiment, the configuration in which one UFS device 6520 and one UFS card 6530 are connected to the host 6510 has been exemplified for convenience of description. However, a plurality of UFS devices and UFS cards may be connected in parallel or in the form of a star to the host 6410, and a plurality of UFS cards may be connected in parallel or in the form of a star to the UFS device 6520 or connected in series or in the form of a chain to the UFS device 6520.

Figure 16:
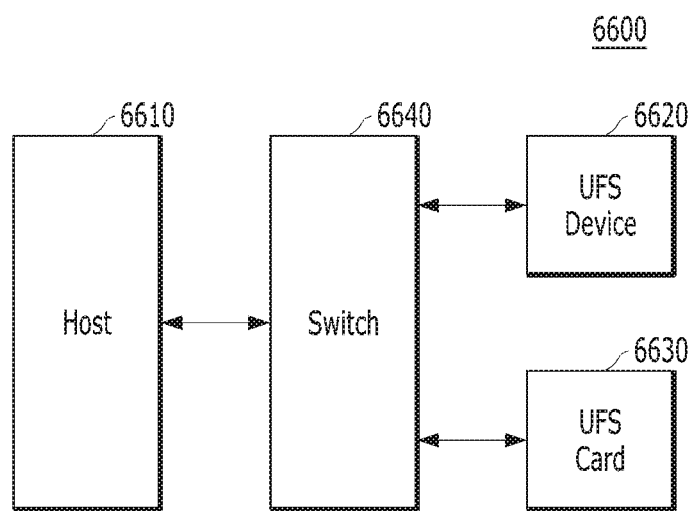

In the UFS system 6600 illustrated in FIG. 16, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the present embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 17:
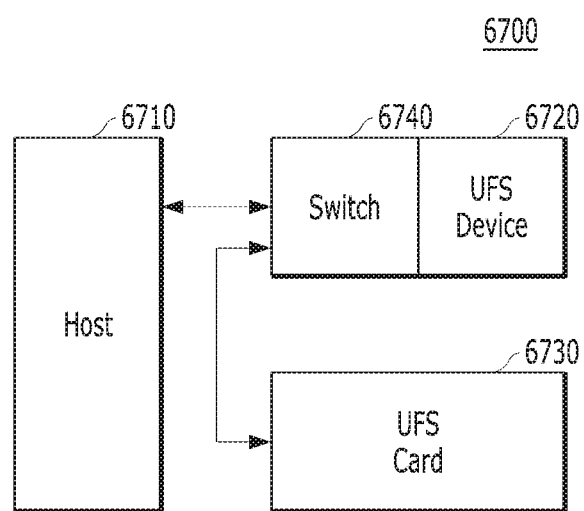

In the UFS system 6700 illustrated in FIG. 17, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. At this time, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In the present embodiment, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 18:
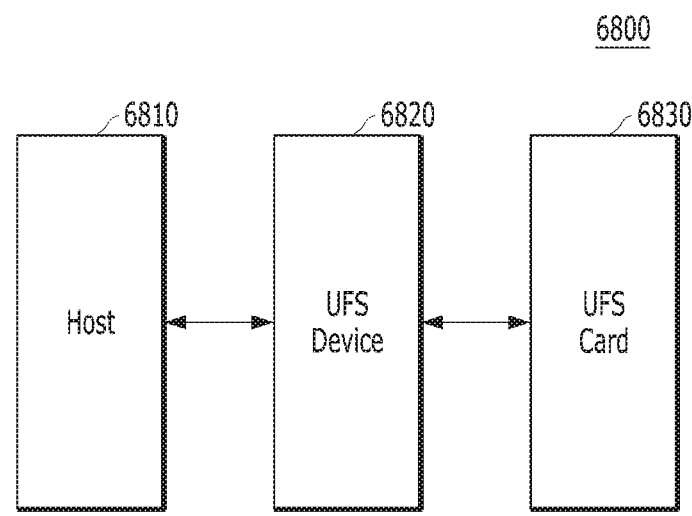

In the UFS system 6800 illustrated in FIG. 18, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. At this time, the host 6810 and the UFS card 6830 may communicate with each other through target ID switching between the M-PHY and UniPro modules of the UFS device 6820. In the present embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 19:
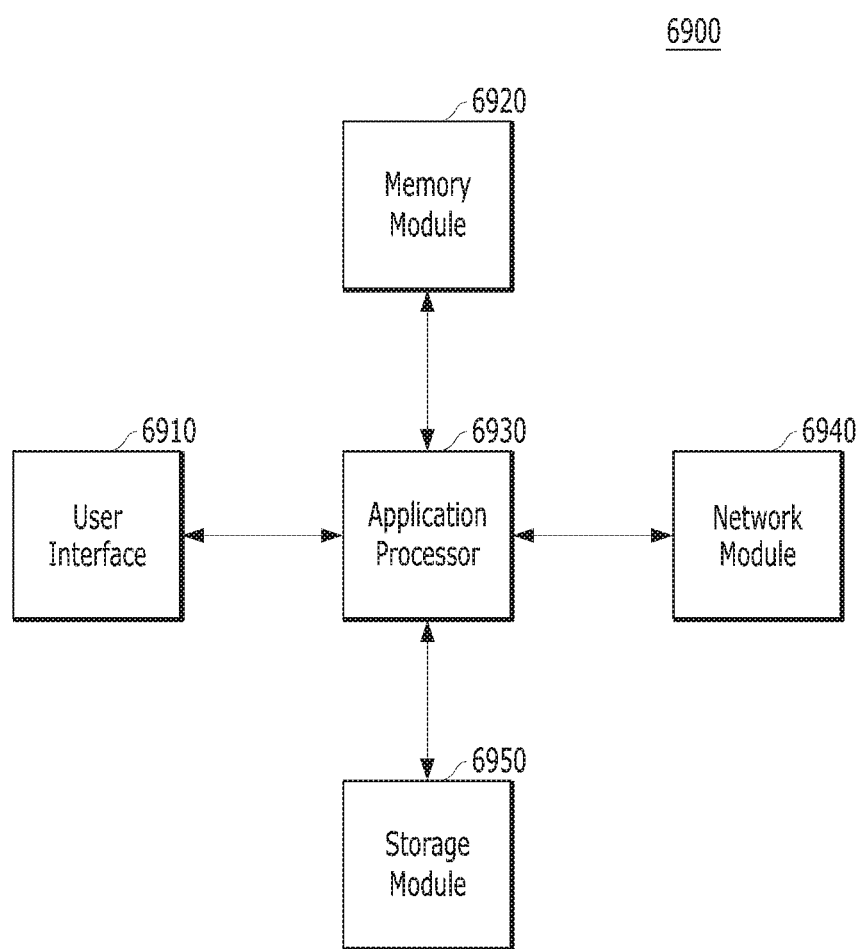

FIG. 19 is a diagram schematically illustrating another example of the data processing system including the memory system in accordance with an embodiment. FIG. 19 is a diagram schematically illustrating a user system to which the memory system in accordance with the present embodiment is applied.

Referring to FIG. 19, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as DRAM, SDRAM, DDR SDRAM, DDR2 SDRAM, DDR3 SDRAM, LPDDR SDARM, LPDDR3 SDRAM or LPDDR3 SDRAM or a nonvolatile RAM such as PRAM, ReRAM, MRAM or FRAM. For example, the application processor 6930 and the memory module 6920 may be packaged and is mounted, based on POP (Package on Package).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wumax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIGS. 1 and 5. Furthermore, the storage module 6950 may be embodied as an SSD, eMMC and UFS as described above with reference to FIGS. 13 to 18.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIGS. 1 and 5 is applied to a mobile electronic device of the user system 6900, the application processor 6930 may control overall operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

The memory system and the operating method thereof according to the embodiments may minimize complexity and performance deterioration of the memory system and maximize use efficiency of a memory device, thereby quickly and stably process data with respect to the memory device.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
   a memory device including a plurality of memory blocks each having a plurality of pages; and
   a controller suitable for controlling the memory device to perform program operations in the pages,
   wherein the memory device checks program voltage distributions of the programmed pages, checks fail bits in the programmed pages, and confirms a partial program success according to the checked fail bits numbers, and
   wherein the controller receives a status signal indicating the partial program success from the memory device, confirms the partial program success of the programmed pages in the program operations in correspondence to the status signal, and performs a copy operation for first data stored in the programmed pages corresponding to the partial program success, in the memory blocks.

2. The memory system according to claim 1, wherein the memory device checks the fail bits for the respective program voltage distributions, counts fail bit numbers of the fail bits for the respective program voltage distributions, and confirms the partial program success according to the fail bit numbers.

3. The memory system according to claim 2, wherein the memory device sums the fail bit numbers for the respective program voltage distributions for respective program voltage distribution groups, and confirms a program voltage distribution group of which summed fail bit number is smaller than a threshold, as a partially successful program voltage distribution group corresponding to the partial program success.

4. The memory system according to claim 3, wherein the memory device sums the fail bit numbers for the respective program voltage distributions for the respective program voltage distribution groups by summing a first summed fail bit number of a first program voltage distribution group, a second summed fail bit number of a second program voltage distribution group, and a third summed fail bit number of a third program voltage distribution.

5. The memory system according to claim 4,
wherein the first program voltage distribution group includes program voltage distributions corresponding to least significant bit (LSB) pages in the memory blocks,
wherein the second program voltage distribution group includes program voltage distributions corresponding to central significant bit (CSB) pages in the memory blocks, and
wherein the third program voltage distribution group includes program voltage distributions corresponding to most significant bit (MSB) pages in the memory blocks.

6. The memory system according to claim 3, wherein the threshold represents a maximum error-correction capability of the controller.

7. The memory system according to claim 3, wherein the controller identifies first pages of a first memory block corresponding to the partially successful program voltage distribution group, and reads and error-corrects the first data stored in the first pages.

8. The memory system according to claim 7, wherein the controller controls the memory device to store the error-corrected first data in at least ones of second pages of the first memory block and first pages of a second memory block.

9. The memory system according to claim 8, wherein the first data is one of entire data stored in the first pages and data stored in pages in which fail bits are included, among the first pages.

10. The memory system according to claim 1, wherein the memory device checks a highest level program voltage distribution among the program voltage distributions, and, when the highest level program voltage distribution is a pass, checks the fail bits in the remaining program voltage distributions.

11. The memory system according to claim 1, further comprising:
a check component suitable for checking the program voltage distributions in the memory blocks through a current sensing circuit (CSC), and outputting the status signal indicating the partial program success to the controller, and comprising:
an operation check component including the current sensing circuit, and suitable for checking the program voltage distributions;
a counter suitable for counting the fail bits in the program voltage distributions;
a sum component suitable for summing the fail bit numbers of counted fail bits;
a comparator suitable for comparing the summed fail bit number of the fail bit numbers and the threshold; and
a storage suitable for storing the fail bit numbers, the summed fail bit number and the threshold.

12. A method for operating a memory system, comprising:
performing program operations for a memory device including a plurality of memory blocks each having a plurality of pages;
checking program voltage distributions of the programmed pages;
checking fail bits in the programmed pages;
confirming a partial program success of the programmed pages according to the checked fail bits numbers in the program operations; and
performing a copy operation for first data stored in the programed pages corresponding to the partial program success, in the memory blocks.

13. The method according to claim 12, wherein the checking of the fail bits comprises:
checking the fail bits for the respective program voltage distributions;
counting fail bit numbers of the fail bits for the respective program voltage distributions; and
summing the fail bit numbers for the respective program voltage distributions for respective program voltage distribution groups.

14. The method according to claim 13, wherein the confirming of the partial program success comprises
confirming a program voltage distribution group of which summed fail bit number is smaller than a threshold, as a partially successful program voltage distribution group corresponding to the partial program success.

15. The method according to claim 14, wherein the threshold represents a maximum error-correction capability of a controller of the memory device.

16. The method according to claim 14, wherein the performing of the copy operation comprises:
identifying first pages of a first memory block corresponding to the partially successful program voltage distribution group;
reading and error-correcting the first data stored in the first pages; and
storing the error-corrected first data in at least ones of second pages of the first memory block and first pages of a second memory block.

17. The method according to claim 16, wherein the first data is one of entire data stored in the first pages and data stored in pages in which fail bits are included, among the first pages.

18. The method according to claim 13, wherein the summing of the fail bit numbers for the respective program voltage distributions for the respective program voltage distribution groups comprises:
summing a first summed fail bit number of a first program voltage distribution group, a second summed fail bit number of a second program voltage distribution group, and a third summed fail bit number of a third program voltage distribution.

19. The method according to claim 18,
wherein the first program voltage distribution group includes program voltage distributions corresponding to least significant bit (LSB) pages in the memory blocks,
wherein the second program voltage distribution group includes program voltage distributions corresponding to central significant bit (CSB) pages in the memory blocks, and
wherein the third program voltage distribution group includes program voltage distributions corresponding to most significant bit (MSB) pages in the memory blocks.

20. The method according to claim 12, wherein the checking of the fail bits comprises:
   checking a highest level program voltage distribution among the program voltage distributions; and
   checking, when the highest level program voltage distribution is a pass, the fail bits in the remaining program voltage distributions.

21. A memory system comprising:
   a memory device including:
   first and second logical pages; and
   a peripheral circuit suitable for:
   performing program and verify operations on the first logical page;
   performing, when the verify operation fails, a count operation of counting a number of failed bits of the first logical page; and
   performing, when the number of failed bits is smaller than an error-correction capability of a controller, a program operation of programming data of the first logical page, which is error-corrected, into the second logical page; and
   the controller suitable for:
   controlling the program, verify, count and copy operations;
   determining whether the verify operation fails and whether the number of failed bits is smaller than the error-correction capability; and
   error-correcting the data of the first logical page.

* * * * *